United States Patent
Mittal et al.

(10) Patent No.: US 11,910,552 B2
(45) Date of Patent: Feb. 20, 2024

(54) ELECTRONIC DEVICES WITH CORROSION-RESISTANT COLORED METAL STRUCTURES

(71) Applicant: Apple Inc., Cupertino, CA (US)

(72) Inventors: Manish Mittal, San Jose, CA (US); Brian S. Tryon, Redwood City, CA (US); James A. Yurko, Saratoga, CA (US); Jing Zhou, San Jose, CA (US); Matthew S. Rogers, San Jose, CA (US); Naoto Matsuyuki, Kasugai (JP)

(73) Assignee: Apple Inc., Cupertino, CA (US)

( * ) Notice: Subject to any disclaimer, the term of this patent is extended or adjusted under 35 U.S.C. 154(b) by 535 days.

(21) Appl. No.: 16/904,501

(22) Filed: Jun. 17, 2020

(65) Prior Publication Data

US 2021/0400830 A1 Dec. 23, 2021

(51) Int. Cl.
*H05K 5/04* (2006.01)
*H05K 5/00* (2006.01)
*H05K 5/02* (2006.01)
*C08K 3/08* (2006.01)

(52) U.S. Cl.
CPC ............. *H05K 5/04* (2013.01); *C08K 3/08* (2013.01); *H05K 5/0017* (2013.01); *H05K 5/0086* (2013.01); *H05K 5/0217* (2013.01); *C08K 2003/0831* (2013.01)

(58) Field of Classification Search
CPC ...... H05K 5/04; H05K 5/0017; H05K 5/0086; H05K 5/0217; C08K 3/08; C08K 2003/0831
See application file for complete search history.

(56) References Cited

U.S. PATENT DOCUMENTS

| | | | |
|---|---|---|---|
| 6,368,758 B1 | 4/2002 | Camp et al. | |
| 7,491,356 B2 | 2/2009 | Heikkila | |
| 7,713,955 B2 | 5/2010 | Whiteford et al. | |
| 8,034,866 B2 | 10/2011 | Zhu et al. | |
| 8,367,159 B2 | 2/2013 | Gray et al. | |
| 8,830,662 B2 * | 9/2014 | Myers | H05K 5/0213 361/679.01 |
| 9,675,994 B2 * | 6/2017 | Schoenfisch | B05D 1/02 |
| 2013/0287955 A1 * | 10/2013 | Portet | C10M 107/00 564/201 |
| 2015/0118486 A1 * | 4/2015 | Richard | C10M 109/00 428/447 |
| 2017/0267581 A1 * | 9/2017 | Zhao | C03C 17/42 |
| 2018/0027150 A1 * | 1/2018 | Rogers | H04N 5/2252 361/679.01 |

OTHER PUBLICATIONS

A Short-Chain Multibranched Perfluoroalkyl Thiol for More Sustainable Hydrophobic Coatings, Dichiarante et al., ACS Sustainable Chem. Eng. 2018, 6, 9734-9743.*

* cited by examiner

*Primary Examiner* — Haidung D Nguyen
(74) *Attorney, Agent, or Firm* — Treyz Law Group, P.C.; G. Victor Treyz; David K. Cole

(57) ABSTRACT

An electronic device may have a housing. The device may include metal structures such as a metal member forming a portion of the housing, a portion of a strap, or other portions of the device. A gold-containing coating such as a layer of elemental gold or a gold alloy may cover the metal member to provide the metal member with a gold appearance or other desired appearance. To protect the metal member and the gold-containing coating, the metal member and gold-containing coating may be covered with a protective coating layer such as an organic protective layer. The organic protective layer may have a fluoropolymer layer with thiol coupling groups to promote adhesion to the gold-containing layer or may contain a polymer layer with silane and thiol coupling groups that serves as an adhesion promotion layer for an overlapping fluoropolymer layer with silane coupling groups.

19 Claims, 3 Drawing Sheets

ELECTRONIC DEVICES WITH CORROSION-RESISTANT COLORED METAL STRUCTURES

FIELD

This relates generally to electronic devices, and, more particularly, to electronic devices with colored structures.

BACKGROUND

Electronic devices may have displays and other components mounted in a housing. Electronic device structures such as housings may be formed from metal. A coating may be used to provide the metal with a desired appearance.

SUMMARY

An electronic device may have a housing, wrist strap, and/or other structures formed from metal. A metal member in an electronic device may be covered with a cosmetic coating.

The cosmetic coating may include a metal coating layer such as a gold-containing coating that imparts a gold appearance to the metal member. The gold-containing coating may be a layer of elemental gold or a layer of gold alloy.

To protect the metal member and the gold-containing coating, the metal member and gold-containing coating may be covered with a protective coating layer such as an organic protective layer. The organic protective layer may have a fluoropolymer layer with thiol coupling groups to promote adhesion to the gold-containing layer or may contain a polymer layer with silane and thiol coupling groups that serves as an adhesion promotion layer that promotes adhesion of an overlapping fluoropolymer layer with silane coupling groups.

DETAILED DESCRIPTION

An electronic device may have a display and other components mounted in a housing. The housing may be coupled to a strap or to other structures. Metal structures in the device such as portions of the housing, strap, or other structures may be coated with a cosmetic coating layer. The cosmetic coating layer may provide the metal structures with a desired appearance such as a desired color. For example, a metal housing wall or a metal member in a strap may be coated with a cosmetic layer of metal such as a gold layer to provide the metal member with a gold appearance.

To help prevent corrosion, a protective layer may be formed on top of the gold layer. The protective layer may be an organic layer. To ensure that the organic layer adheres satisfactorily to the gold layer, the organic layer may be formed from an oleophobic coating such as a fluoropolymer with a thiol coupling group or the organic layer may include a bi-functional polymer containing thiol coupling groups and silane coupling groups that serves as an adhesion layer for an overlapping oleophobic coating such as a fluoropolymer with a silane coupling group. In these organic layers, the thiol coupling groups exhibit satisfactory bonding with the underlying gold layer, thereby ensuring that the protective layer is well adhered to the gold layer.

Figure 1:
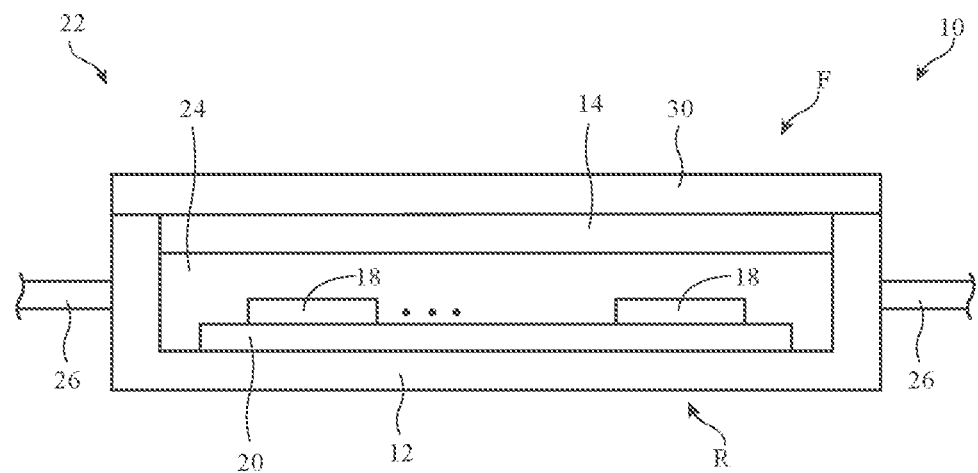
FIG. 1 is a side view of an illustrative electronic device in accordance with an embodiment.

A cross-sectional side view of a portion of an illustrative electronic device with metal members is shown in FIG. 1. In the example of FIG. 1, device 10 is a portable device such as a cellular telephone, wristwatch, or tablet computer. In general, any type of electronic device may have metal structures (e.g., metal housing walls or other metal members) such as a desktop computer, a voice-control speaker, a television or other non-portable display, a head-mounted device, an embedded system such as a system built into a vehicle or home, an electronic device accessory, and/or other electronic equipment.

Device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions such as interior region 24 and may separate interior region 24 from exterior region 22. In some configurations, an opening may be formed in housing 12 for a data port, a power port, to accommodate audio components, or to accommodate other devices. Clear housing regions may be used to form optical component windows. Dielectric housing structures may be used to form radio-transparent areas for antennas and wireless power components.

Device 10 may, if desired, have a band such as wristband 26 (e.g., device 10 may be a wristwatch in which housing 12 forms an enclosure for a main wristwatch unit and in which wristband 26 forms a strap or other watch band configured to be worn around a user's wrist). Arrangements in which wristband 26 is omitted and/or in which device 10 has other housing structures and/or support structures that allow device 10 to be worn on a body part of a user may be used, if desired.

In an illustrative configuration, which may sometimes be described herein as an example, device 10 includes wristband 26 and wristband 26 and/or portions of housing 12 (e.g., sidewall portions, rear housing wall portions, etc.) are formed from metal. The metal that forms these metal members or other metal structures in device 10 may be stainless steel, aluminum, and/or other elemental metals and/or metal alloys.

Electrical components 18 may be mounted in interior region 24 (e.g., components 18 may be coupled to and enclosed within housing 12). Electrical components 18 may include integrated circuits, discrete components, light-emitting components, sensors, and/or other circuits and may, if desired, be interconnected using signal paths in one or more printed circuits such as printed circuit 20. If desired, one or more portions of the housing walls may be transparent (e.g., so that light associated with an image on a display or other light-emitting or light-detecting component can pass between interior region 24 and exterior region 22).

Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14. The displays may, for example, include an organic light-emitting diode display, a liquid crystal display, a display having an array of pixels formed from respective light-emitting diodes (e.g., a pixel array having pixels with crystalline light-emitting diodes formed from respective light-emitting diode dies such as micro-light-emitting diode dies), and/or other displays. The displays may include rigid display structures and/or may be flexible displays. Display 14 may have a rectangular pixel array or a pixel array of another shape for displaying images for a user and may therefore sometimes be referred to as a pixel array. Display 14 may also sometimes be referred to as a display panel, display layer, or pixel layer. Each pixel array in device 10 may be mounted under a transparent housing structure (sometimes referred to as a display cover layer). In the example of FIG. 1, display (pixel array) 14 is mounted under display cover layer 30. Display cover layer 30 (which may be considered to form a portion of the housing of device 10), covers front face F of device 10. Configurations in which opposing rear face R of device 10 and/or sidewall portions of device 10 have transparent structures covering displays and other optical components may also be used. Layer 30 may be formed from a layer of glass, clear polymer, crystalline material such as sapphire or other crystalline material, and/or other transparent material. The presence of layer 30 may help protect display 14 from scratches.

To provide a desired appearance to metal members such as metal portions of wristband 20 (e.g. metal links or other metal structures in band 20) and/or metal portions of housing 12 (e.g., housing walls on rear face R, sidewall housing structures, and/or portions of housing 12 on front face F), some or all of these metal members may be provided with a cosmetic coating. The cosmetic coating may include, for example, one or more metal layers that change the outward appearance the coated metal members.

In an illustrative configuration, which may sometimes be described herein as an example, metal members in device 10 are coated with a cosmetic layer that includes gold (e.g., a gold-containing layer). The cosmetic layer may, for example, include an elemental gold layer, a layer of a gold alloy, a layer of a gold alloy or other metal covered with a gold coating, and/or other layer containing gold. The thickness of the gold-containing layer may be, as an example, 5-50 nm, at least 5 nm, at least 10 nm, at least 20 nm, less than 100 nm, etc. The presence of gold in this cosmetic layer may provide a coated metal member with a desired appearance such as a gold color.

The gold of the cosmetic layer may exhibit a different potential than underlying metal layers, which can give rise to a risk of corrosion. To prevent corrosion, a protective layer may be formed over the cosmetic layer. The protective layer may be, for example, a dielectric layer such as an organic coating layer. In an illustrative configuration, the organic coating layer includes an oleophobic coating material to help conceal fingerprints. Fluoropolymers or other oleophobic substances may be used in forming oleophobic coatings.

It can be challenging to adhere polymers to gold. To ensure that the protective layer adheres satisfactorily to the cosmetic coating layer, the cosmetic coating layer may be provided with a polymer that has thiol (—SH) coupling groups (e.g., fluoropolymer chains or other polymer chains that are terminated with thiol groups). The presence of the thiol groups helps bond and thereby adhere the polymer chains to the gold of the cosmetic coating layer.

Figure 2:
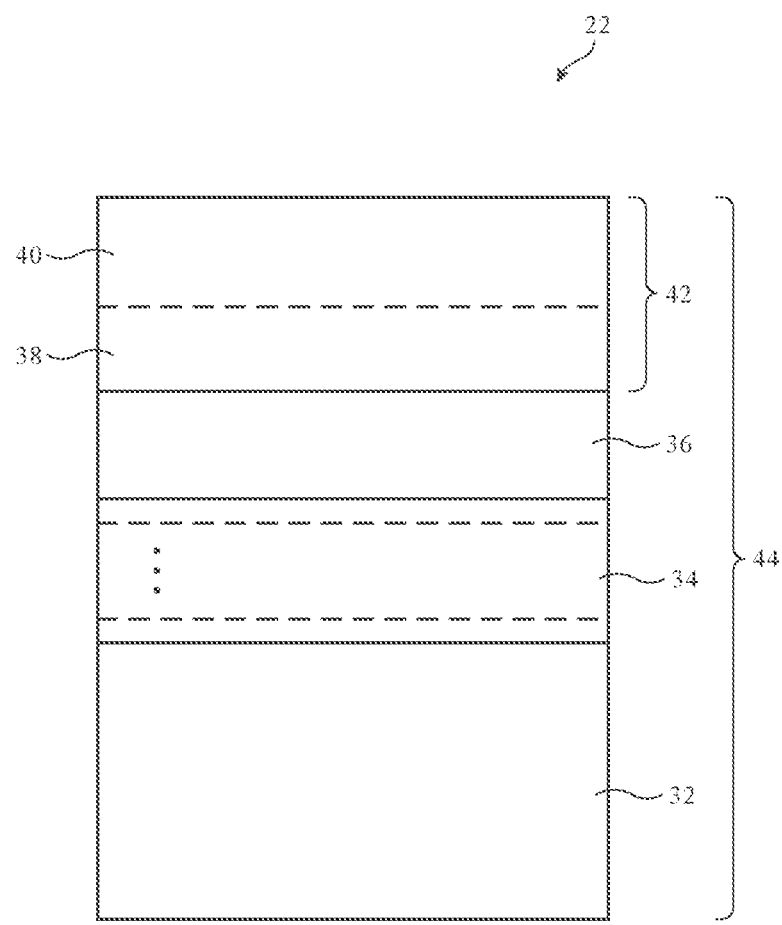
FIGS. 2 and 3 are cross-sectional side views of portions of illustrative coated metal members in an electronic device such as the electronic device of FIG. 1 in accordance with an embodiment.

A first illustrative configuration for coating metal members in device 10 is shown in FIG. 2. As shown in FIG. 2, coated structures 44 may include a support structure such as metal member 32. Metal member 32 may be part of band 20, part of housing 12, or other metal structure in device 10 (e.g., a structure with an outwardly facing surface facing exterior region 22 that is viewable by a user). Metal member 32 may be formed from stainless steel, aluminum, other elemental metals, other metal alloys, etc.

Metal member 32 may be covered with a coating such as coating 34. Coating 34 may be deposited using physical vapor deposition, electrodeposition, and/or other deposition techniques. Coating 34 may include one or more different layers of metal or other materials and/or may include metals or other materials that exhibit composition gradients (e.g., smooth changes in composition as a function of distance through the coating). Examples of materials that may be used in forming coating 34 include titanium, chromium, carbon, nitrogen, silicon, and tantalum (as examples). Other materials may be used in coating 34 if desired. The layers in coating 34 may be used to promote adhesion, enhance strength and durability, adjust the appearance of structures 44 (e.g., to help create a desired color or other cosmetic appearance), and/or to promote surface wear resistance. As an example, an initial layer of coating 34 may be formed from a metallic seed layer such as a layer of chromium or titanium (e.g., a layer of 100 nm in thickness or other suitable thickness) that promotes adhesion between member 32 and subsequently deposited layers. Additional layer(s) may be deposited on this adhesion promotion layer. For example, additional layer(s) of metal may be formed on this layer to enhance strength and to promote durability. The thickness of coating 34 may be 1-3 microns, at least 0.1 microns, at least 0.5 microns, at least 1 micron, at least 2 microns, less than 10 microns, less than 5 microns, less than 3 microns, or other suitable thickness.

Metal layer 36 may be a gold-containing layer formed from elemental gold and/or a gold alloy (e.g., an alloy of gold with one or more metals such as platinum, palladium, copper, and/or other metals). Layer 36 may have a thickness of 5-50 nm, at least 5 nm, at least 10 nm, at least 20 nm, less than 100 nm, or other suitable thickness and may provide structures 44 with a gold appearance or other suitable appearance.

A protective layer such as organic protective layer 42 may be formed as a protective coating on the outer surface of layer 36. Layer 42 may be formed from a polymer such as fluoropolymer. Fluoropolymer chains in layer 42 (e.g., fluoropolymer 40, which may be a monolayer of fluoropolymer material) may be terminated by thiol (—SH) coupling groups (e.g., thiol coupling groups 38). The thiol of layer 42 bonds with the gold of layer 36, thereby helping to satisfactorily adhere layer 42 to the outer surface of layer 36. During use of device 10 by a user, the presence of the fluoropolymer of layer 44 may help to reduce fingerprint visibility.

The presence of layer 42 may also help to prevent corrosion. After layer 34 is deposited on layer 32, layer 34 may interact somewhat with layer 32 and, as a result, there may be defect paths through layer 34 to the surface of layer 32. In the absence of layer 42, there is a potential risk that moisture from a user's fingers will reach layer 32. In the presence of layer 42, however, moisture from the user's fingers is blocked and corrosion is prevented.

Figure 3:
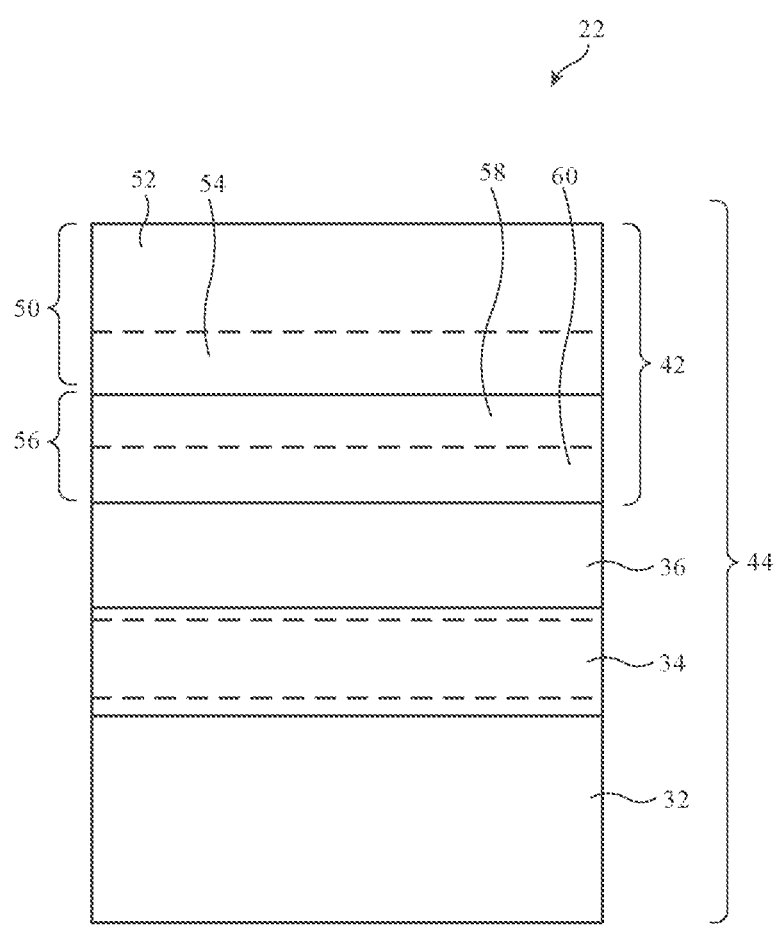

A second illustrative configuration for coating metal members in device 10 is shown in FIG. 3. In the illustrative configuration of FIG. 3, organic protective layer 42 of coated structures 44 includes bi-functional polymer layer 56. Layer 56 may be, for example, a monolayer of a polymer with chains that are terminated by silane ($Si(OCH_3)_3$) coupling groups and thiol coupling groups. The thickness of layer 56 may be about 5 nm. Layer 56 and the other portions of layer 42 may be deposited by physical vapor deposition (e.g., evaporation), dip coating, spray coating, or other coating techniques.

Layer 56 may be covered by oleophobic layer 50. Layer 50 may be a fluoropolymer layer formed from fluoropolymer chains (fluoropolymer layer 52 of FIG. 3) terminated with silane coupling groups (silane layer 54). Layer 50 may be a monolayer with a thickness of about 5 nm.

Bi-functional polymer layer 56 may serve as an adhesion layer for fluoropolymer layer 50. The thiol (layer 60) of layer 56 reacts with the gold of layer 36, thereby bonding layer 56 to layer 36. The silane (layer 58) of layer 56 reacts with the silane coupling groups (layer 54) of layer 50. This helps adhere layer 50 to layer 56 and thereby helps adhere layer 50 to layer 36.

As with the arrangement of FIG. 2, the presence of the fluoropolymer of layer 42 of FIG. 3 helps reduce fingerprint visibility and helps prevent corrosion.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is illustrative and various modifications can be made to the described embodiments. The foregoing embodiments may be implemented individually or in any combination.

What is claimed is:

1. An electronic device, comprising:
   electrical components; and
   a metal member coupled to the electrical components, wherein the metal member has an exterior surface covered with a coating and wherein the coating includes:
      a gold-containing layer that covers the exterior surface, and
      an organic protective layer that covers the gold-containing layer, wherein the organic protective layer comprises a fluoropolymer layer with silane coupling groups and a polymer layer with silane coupling groups and thiol coupling groups, wherein the polymer layer is interposed between the gold-containing layer and the fluoropolymer layer.

2. The electronic device defined in claim 1 wherein the thiol coupling groups of the polymer layer bond with the gold-containing layer.

3. The electronic device defined in claim 2 further comprising a metal adhesion layer between the exterior surface and the gold-containing layer.

4. The electronic device defined in claim 3 wherein the metal adhesion layer comprises a metal selected from the group consisting of chromium and titanium.

5. The electronic device defined in claim 1 further comprising a layer between the metal member and the gold-containing layer, wherein the layer between the metal member and gold-containing layer comprises an element selected from the group consisting of: titanium, chromium, carbon, nitrogen, silicon, and tantalum.

6. The electronic device defined in claim 1 wherein the gold-containing layer is a layer of gold.

7. The electronic device defined in claim 1 wherein the gold-containing layer is a gold alloy comprising an element selected from the group consisting of: platinum, palladium, and copper.

8. The electronic device defined in claim 1 wherein the silane coupling groups of the fluoropolymer layer are configured to bond to the silane coupling groups of the polymer layer.

9. The electronic device defined in claim 8 wherein the thiol coupling groups of the polymer layer are configured to bond to the gold-containing layer.

10. The electronic device defined in claim 9 further comprising a metal adhesion layer between the exterior surface and the gold-containing layer.

11. The electronic device defined in claim 1 wherein the metal member comprises a portion of a watch band, wherein the electronic device comprises a housing that encloses the electrical components, and wherein the watch band is coupled to the housing and the electrical components.

12. The electronic device defined in claim 1 wherein the metal member comprises a portion of a housing enclosing the electrical components.

13. The electronic device defined in claim 12 further comprising a display, wherein the housing has a front face and an opposing rear face, wherein the display is on the front face, and wherein the metal member is on the rear face.

14. An electronic device, comprising:
a display;
a metal housing member coupled to the display;
a watch band coupled to the metal housing member;
a gold-containing layer on the watch band;
a fluoropolymer with first silane coupling groups on the gold-containing layer; and
a polymer layer with second silane coupling groups and thiol coupling groups, wherein the polymer layer forms an adhesion layer between the gold-containing layer and the fluoropolymer.

15. The electronic device defined in claim 14 wherein the gold-containing layer comprises a gold alloy bonded to the thiol coupling groups.

16. The electronic device defined in claim 14 wherein the gold-containing layer comprises a layer of gold bonded to the thiol coupling groups.

17. An electronic device, comprising:
a display;
a metal housing member coupled to the display;
a gold-containing layer on the metal housing member;
a fluoropolymer layer with silane coupling groups; and
a polymer layer with silane coupling groups and thiol coupling groups, wherein the polymer layer forms an adhesion layer between the gold-containing layer and the fluoropolymer layer.

18. The electronic device defined in claim 17 wherein the gold-containing layer comprises a gold alloy bonded to the thiol coupling groups and wherein the silane coupling groups of the fluoropolymer layer promote adhesion with the polymer layer.

19. The electronic device defined in claim 17 wherein the gold-containing layer comprises a layer of gold bonded to the thiol coupling groups and wherein the silane coupling groups of the fluoropolymer layer promote adhesion with the polymer layer.

* * * * *